United States Patent
Boo et al.

(10) Patent No.: US 9,013,216 B2
(45) Date of Patent: Apr. 21, 2015

(54) DIGITAL PHASE-LOCKED LOOP

(71) Applicant: Electronics and Telecommunications Research Institute, Daejeon (KR)

(72) Inventors: Hyun Ho Boo, Incheon (KR); Byung Hun Min, Daejeon (KR); Duong Quoc Hoang, Daejeon (KR); Cheon Soo Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/028,707

(22) Filed: Sep. 17, 2013

(65) Prior Publication Data

US 2014/0266354 A1     Sep. 18, 2014

(30) Foreign Application Priority Data

Mar. 13, 2013   (KR) ........................ 10-2013-0026891

(51) Int. Cl.
*H03L 7/06*     (2006.01)
*H03L 7/08*     (2006.01)

(52) U.S. Cl.
CPC ........................................ *H03L 7/08* (2013.01)

(58) Field of Classification Search
USPC ......................................... 327/156, 158, 161
See application file for complete search history.

(56) References Cited

U.S. PATENT DOCUMENTS 7,629,915 B2 * 12/2009 Lin ................................. 341/166
2012/0098570 A1 * 4/2012 Wang et al. ........................ 327/7

OTHER PUBLICATIONS

Volodymyr Kratyuk et al., "A Digital PLL with a Stochastic Time-to-Digital Converter", IEE Transactions on Circuits and Systems—I: Regular Papers, vol. 56, No. 8, Aug. 2009, pp. 1612-1621.
Marco Zanuso, et al., "Time-to-Digital Converter with 3-ps Resolution and Digital Linearization Algorithm"; pp. 262-265, IEEE, 2010.

* cited by examiner

*Primary Examiner* — John Poos
(74) *Attorney, Agent, or Firm* — Kile Park Reed & Houtteman PLLC

(57) ABSTRACT

Disclosed is a digital phase-locked-loop including: a time-to-digital converter (TDC) configured to output a digital bit based on an input clock and a reference clock, in which the TDC includes: a first arbiter group configured to compensate for a phase difference between the input clock and the reference clock with a first average offset and output a first logic value; a second arbiter group configured to compensate for a phase difference between the input clock and the reference clock with a second average offset and output a second logic value; and a signal processor configured to output the digital bit based on the first and second logic values.

7 Claims, 6 Drawing Sheets

DIGITAL PHASE-LOCKED LOOP

CROSS-REFERENCE TO RELATED APPLICATIONS

This application claims priority to and the benefit of Korean Patent Application No. 10-2013-0026891 filed in the Korean Intellectual Property Office on Mar. 13, 2013, the entire contents of which are incorporated herein by reference.

TECHNICAL FIELD

The present invention relates to a digital phase-locked loop, and more particularly, to a digital phase-locked loop including a time-to-digital converter (TDC) of which an operation range is expanded by using at least two flip-flops or latches having different offsets.

BACKGROUND ART

According to the recent development of technology, a digital phase-locked loop (ADPLL) has been widely used instead of a charge-pump phase-locked loop (CPPLL) having a problem of an analog circuit.

A time-to-digital converter is a significant configuration in the digital phase-locked loop performing the same function as that of a phase-frequency detector (PFD) in the charge-pump phase-locked loop in the related art.

However, the time-to-digital converter, for example, a delay-line based TDC, a stochastic TDC, a time-amplifying TDC, and a ring-oscillator based TDC, of the related art is operated only as a phase-detector (PD) in terms of a narrow operation range.

The phase-detector (PD) may be operated only when a difference between two frequencies is very small, and in a case where a loop band range is decreased in order to decrease jitter, there is a problem in that an operation range of the phase-detector is also decreased.

Recently, researches for expanding an operation range of the time-to-digital converter have currently been conducted.

SUMMARY OF THE INVENTION

The present invention has been made in an effort to provide a digital phase-locked loop including a time-to-digital converter (TDC) of which an operation range is expanded by using at least two flip-flops or latches having different offsets.

An exemplary embodiment of the present invention provides a digital phase-locked-loop including: a time-to-digital converter (TDC) configured to output a digital bit based on an input clock and a reference clock, in which the TDC includes: a first arbiter group configured to compensate for a phase difference between the input clock and the reference clock with a first average offset and output a first logic value; a second arbiter group configured to compensate for a phase difference between the input clock and the reference clock with a second average offset and output a second logic value; and a signal processor configured to output the digital bit based on the first and second logic values.

The digital phase-locked loop according to the exemplary embodiment of the present invention includes a plurality of arbiter groups having different average offsets, so that it is possible to form a time-to-digital converter having an operation range expanded to the offset standard deviation by adjusting the average offset.

The digital phase-locked loop according to the exemplary embodiment of the present invention includes the time-to-digital converter of which an operation range is expanded, so that it is possible to improve resolution by adjusting a specification of the time-to-digital converter.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
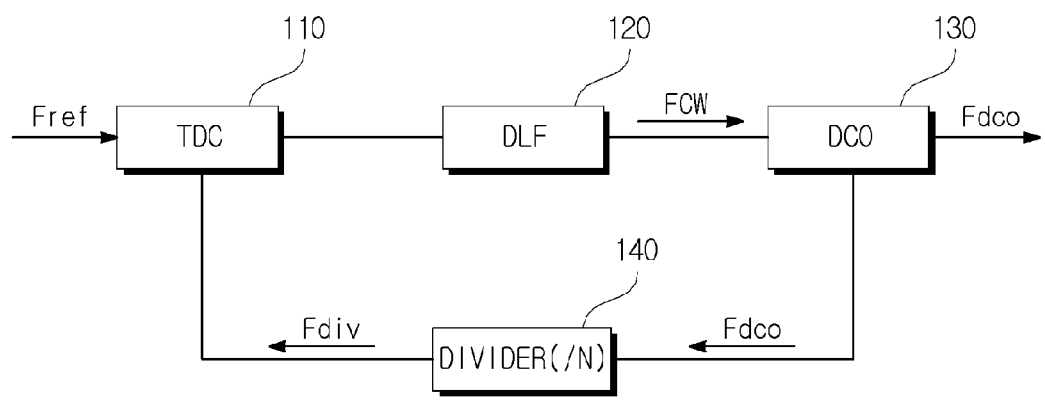
FIG. 1 is a control block diagram illustrating a control configuration of a digital phase-locked loop according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numerals refer to the same or equivalent parts of the present invention throughout the several figures of the drawing.

DETAILED DESCRIPTION

Contents below are simple examples of a principle of the invention. Accordingly, a person skilled in the art may implement the principle of the invention and invent various apparatuses included in a concept and a scope of the invention although it is not clearly described or illustrated in the present specification. All conditional terms and exemplary embodiments enumerated in the present specification are clearly intended only for the purpose of understanding the concept of the invention in principle, and shall not be understood that the conditional terms and exemplary embodiments are limited to the specially enumerated exemplary embodiments and states.

It shall be understood that all detailed descriptions enumerating a specific exemplary embodiment, as well as the principle, the aspect, and the exemplary embodiments of the present invention are intended to include a structural and functional equivalent thereof. It shall be understood that the equivalents include an equivalent to be developed in the future, that is, every element invented so as to perform the same function regardless of a structure, as well as a currently publicly-known equivalent.

Accordingly, for example, a block diagram in the present specification should be understood to indicate an exemplary conceptual point of view for embodying a principle of the present invention. Similarly, all of the flowcharts, state conversion diagrams, and pseudo codes, should be understood to be substantially expressed in computer-readable media and to express a variety of processes performed by a computer or a processor, regardless of whether the computer or the processor is clearly illustrated.

Functions of various devices illustrated in the drawings including functional blocks that are expressed as a processor or a concept similar thereto may be provided for use of dedicated hardware and use of hardware having capability to execute software in association with appropriate software. When the functions are provided by a processor, the functions may be provided by a single dedicated processor, a single shared processor, or a plurality of individual processors, and a part thereof may be shared.

Clear use of the processor, control, or terminology proposed as a similar concept thereto should not be interpreted by exclusively citing hardware having the capability to execute software, and should be understood to allusively include digital signal processor (DSP) hardware, and ROM, RAM, and a non-volatile memory for storing software without restriction. Publicly known and commonly used other hardware may be included.

In the claims of the present specification, constituent elements expressed as means for performing functions described in the detailed description are intended to include, for example, all methods performing a function including a combination of circuit elements performing the function or all types of software including a firmware/microcode, and are combined with a circuit appropriate for executing the software so as to perform the function. Since the invention defined in the claims is combined with functions provided by various numerated means and combined with a scheme demanded by the claim, any means capable of providing the function should be understood to be an equivalent to that recognized from the present specification.

The aforementioned objects, characteristics, and advantages will be more apparent through the detailed description below related to the accompanying drawings, and thus those skilled in the art to which the present invention pertains will easily implement the technical spirit of the present invention. In the following description, a detailed explanation of known related functions and constitutions may be omitted so as to avoid unnecessarily obscuring the subject matter of the present invention.

Hereinafter, an exemplary embodiment according to the present invention will be described in detail with reference to the accompanying drawings.

FIG. 1 is a control block diagram illustrating a control configuration of a digital phase-locked loop according to an exemplary embodiment of the present invention.

Referring to FIG. 1, the digital phase-locked-loop includes a time-to-digital converter (hereinafter, referred to as a "TDC") 110, a digital loop filter (hereinafter, referred to as a "DLF") 120, a digital controlled oscillator (hereinafter, referred to as a "DCO") 130, and a divider 140.

The TDC 110 outputs a digital bit (not illustrated) based on a reference clock Fdiv output from the divider 140 and an input input clock Fref.

The digital bit of the TDC 110 corresponds to a phase difference and a frequency difference between the reference clock Fdiv and the input clock Fref, and the TDC 110 performs the same function as that of a phase-detector on the phase-locked loop by an analog scheme.

The DLF 120 outputs a frequency control word (FCW) in which the digital bit output from the TDC 110 is filtered.

That is, in the DLF 120, an input and an output are all digital signals, and a low band pass filter function, such as a loop filter of an analog phase-locked loop, may be implemented by using a digital logic, but the DLF 120 is not limited thereto.

Here, the FCW is a control signal for decreasing a phase difference between the reference clock Fdiv and the input clock Fref, but is not limited thereto.

The DCO 130 outputs an output clock Fdco, of which an output frequency is changed with the FCW output from the DLF 120, to the divider 140.

The divider 140 feeds back the reference clock Fdiv, which is obtained by dividing the output clock Fdco output from the DCO 130 by a predetermined dividing value N, to the TDC 110.

Figure 2:
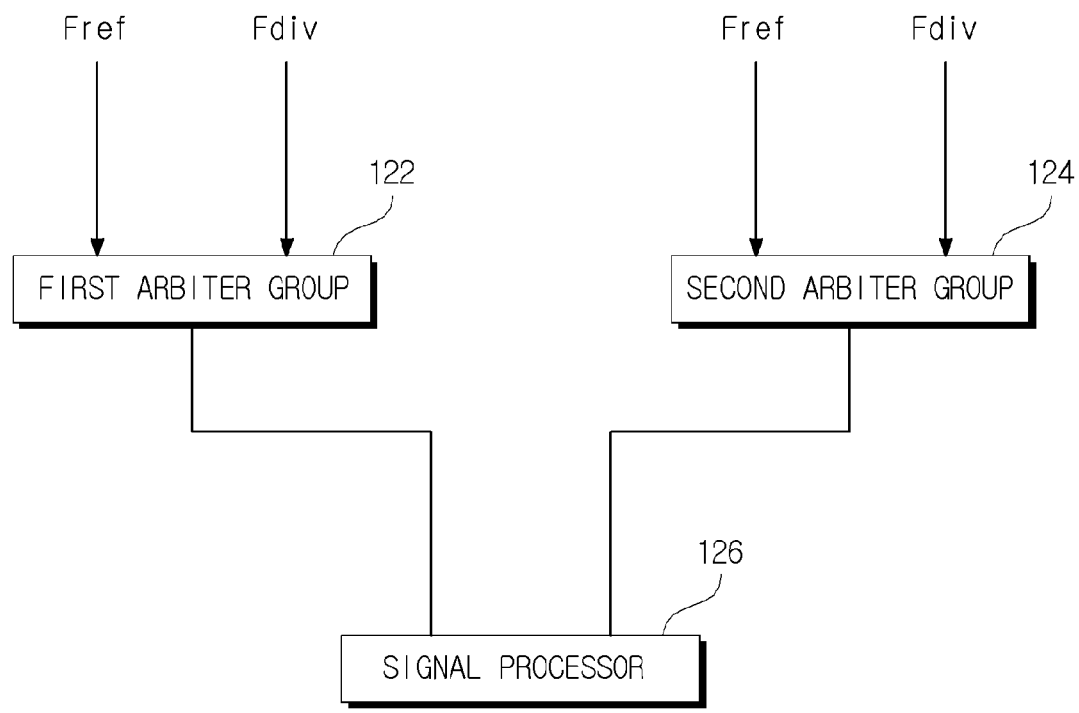
FIG. 2 is a control block diagram illustrating a first exemplary embodiment of the control configuration of a time-to-digital converter (TDC) illustrated in FIG. 1.
Figure 3:
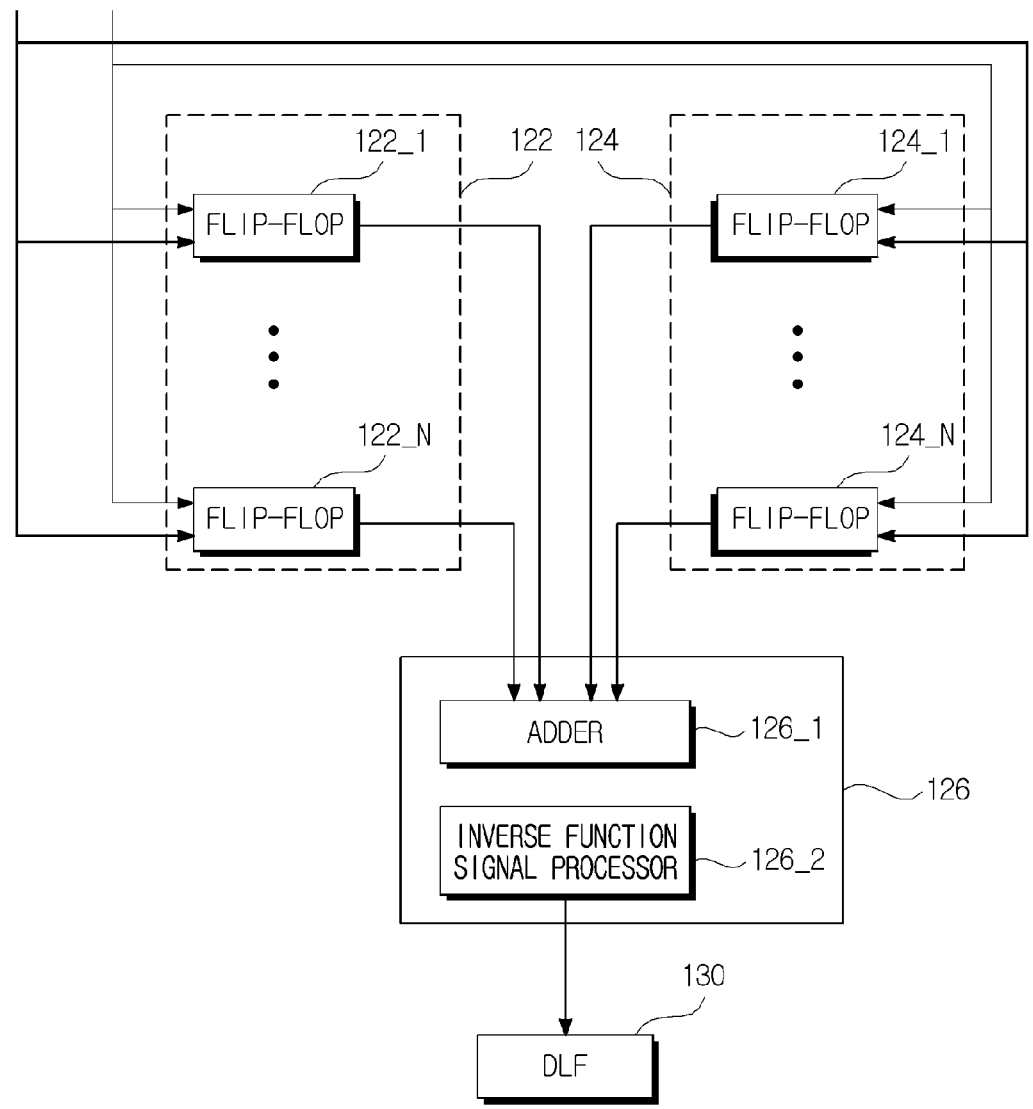
FIG. 3 is a circuit diagram schematically illustrating the time-to-digital converter illustrated in FIG. 2.
Figure 4:
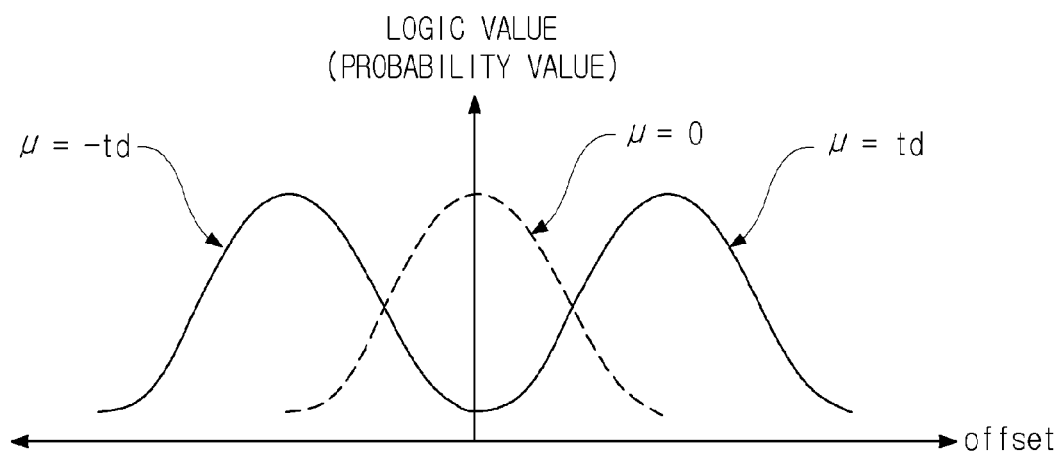
FIG. 4 is an offset distribution diagram formed of first and second arbiter groups illustrated in FIG. 2.

FIG. 2 is a control block diagram illustrating a first exemplary embodiment of the control configuration of a time-to-digital converter (TDC) illustrated in FIG. 1, FIG. 3 is a circuit diagram schematically illustrating the time-to-digital converter illustrated in FIG. 2, and FIG. 4 is an offset distribution diagram formed of first and second arbiter groups illustrated in FIG. 2.

Referring to FIGS. 2 to 4, the TDC 110 includes first and second arbiter groups 122 and 124, and a signal processor 126.

Here, each of the first and second arbiter groups 122 and 124 may include at least one of at least two flip-flops and latches, but is not limited thereto.

In the exemplary embodiment, it is described that each of the first and second arbiter groups 122 and 124 includes the plurality of flip-flops, but the present invention is not limited thereto.

It is described that the plurality of flip-flops 122_1 to 122_N, and 124_1 to 124_N are D flip-flops, and the reference clock Fdiv and the input clock Fref are input to each of the plurality of flip-flops 122_1 to 122_N, and 124_1 to 124_N, and each of the plurality of flip-flops 122_1 to 122_N, and 124_1 to 124_N outputs a logic value for the phase difference between the reference clock Fdiv and the input clock Fref.

First, at least one of the plurality of flip-flops 122_1 to 122_N included in the first arbiter group 122 may have an offset different from that of another flip-flop, but is not limited thereto.

Accordingly, the plurality of flip-flops 122_1 to 122_N included in the first arbiter group 122 may have a first average offset, and transmits a first logic value including a logic value output from each of the plurality of flip-flops 122_1 to 122_N to the signal processor 126.

The first logic values may be probability values for the logic values output from the plurality of respective flip-flops 122_1 to 122_N, and the probability values may be distributed based on the first average offset.

At least one of the plurality of flip-flops 124_1 to 124_N included in the second arbiter group 124 may have an offset different from another flip-flop, and is not limited thereto.

Accordingly, the plurality of flip-flops 124_1 to 124_N included in the second arbiter group 124 may have a second average offset, and transmits a second logic value including a logic value output from each of the plurality of flip-flops 124_1 to 124_N to the signal processor 126.

The second logic values may be probability values for the logic values output from the plurality of respective flip-flops 124_1 to 124_N, and the probability values may be distributed based on the second average offset.

Here, the signal processor 126 may accurately determine a time difference compensating for the offset based on the logic values output from the plurality of respective flip-flops 122_1 to 122_N, and 124_1 to 124_N included in the first and second arbiter groups 122 and 124, that is, information on a time difference at rising edges between the reference clock Fdiv and the input clock Fref.

That is, the signal processor 126 may include an adder 126_1 for adding the first and second logic values, and an inverse function signal processor 126_2 for processing inverse function signals for the first and second logic values added in the adder 126_1, and outputting the quantized and delayed digital bit.

Here, the offset distribution diagram illustrated in FIG. 4 may have the Gaussian distribution in which a general arbiter group has a statistically ideal offset, and an offset average value ($\mu$=0), and has an average value (($\mu$=td) of any one of the first and second arbiter groups 122 and 124, and may have an average value ($\mu$=−td) of the other one thereof.

In this case, the first and second arbiter groups 122 and 124 may have the first and second offset average values ($\mu$=td and $\mu$=−td), which are formed wider than the offset average value ($\mu$=0), so that the operation range of the TDC 110 may be increased.

In the exemplary embodiment, it is described that the TDC 110 includes the two first and second arbiter groups 122 and 124, but the TDC 110 may include three arbiter groups as illustrated in FIG. 4, and the offset average values of the three arbiter groups may be combined to have $\mu$=0, $\mu$=td, and $\mu$=−td, respectively. Accordingly, as a distribution of the combined offset average values is wide, the operation range of the TDC 110 may be increased.

As described above, when the operation range of the TDC 110 is increased, resolution may be decreased, and the resolution and the operation range may be adjusted.

Figure 5:
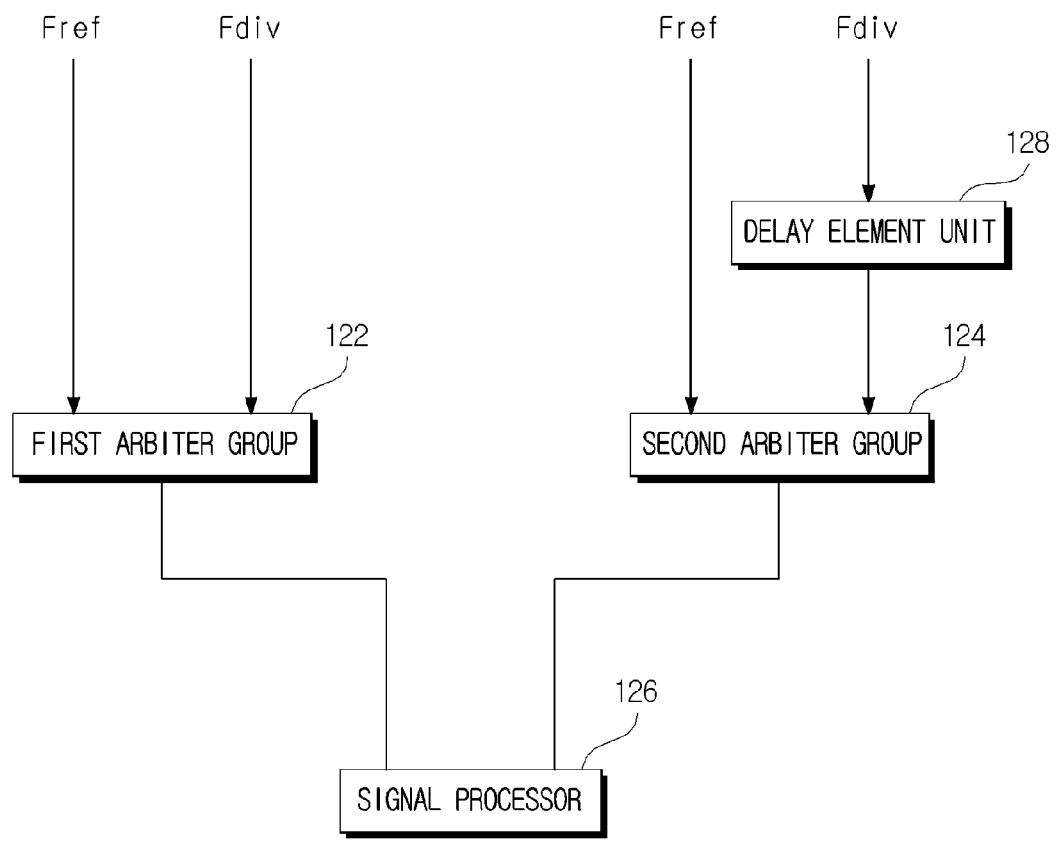
FIG. 5 is a control block diagram according to a second exemplary embodiment of the control configuration of the time-to-digital converter (TDC) illustrated in FIG. 1.
Figure 6:
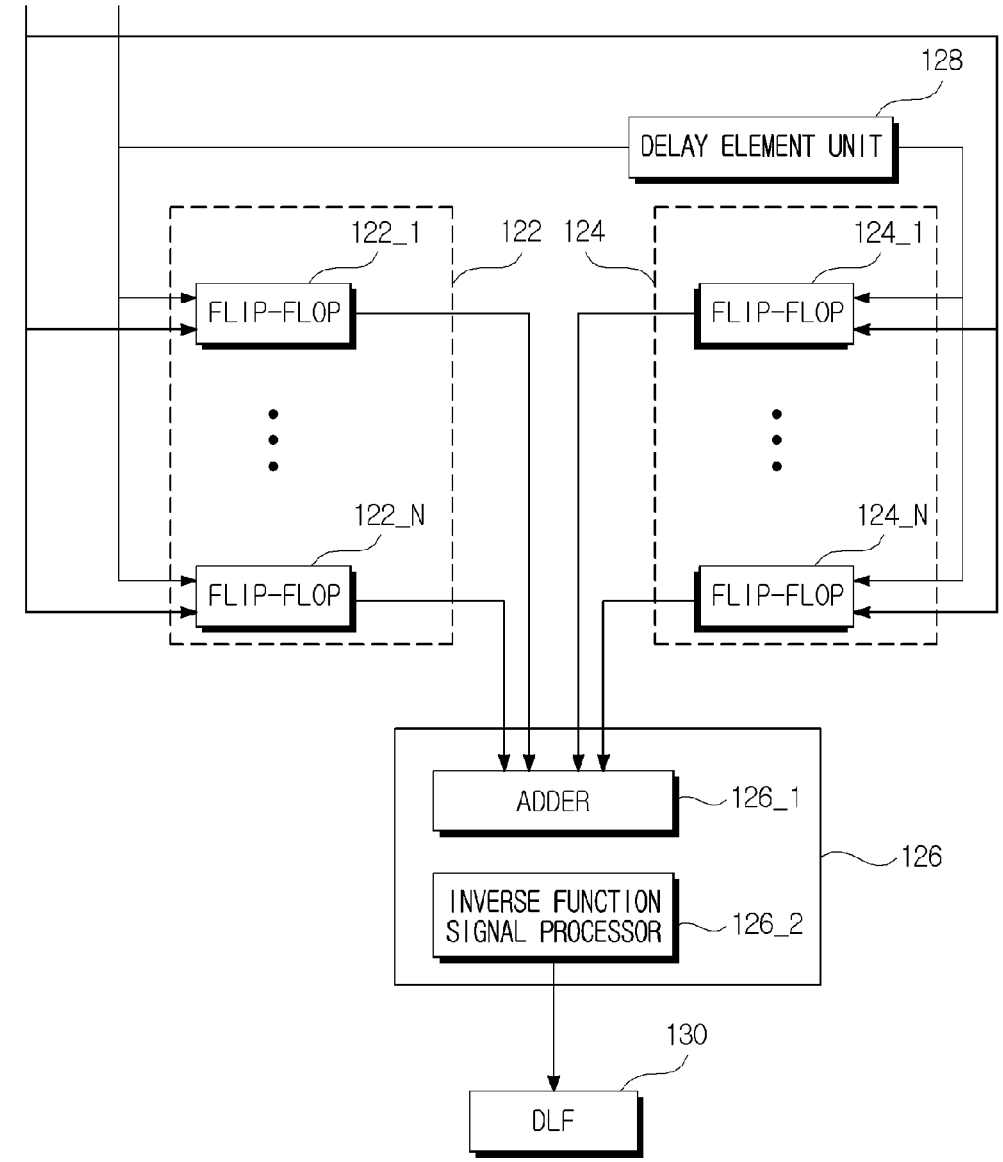
FIG. 6 is a circuit diagram schematically illustrating the time-to-digital converter illustrated in FIG. 5.

FIG. 5 is a control block diagram illustrating a second exemplary embodiment of the control configuration of a time-to-digital converter (TDC) illustrated in FIG. 1, and FIG. 6 is a circuit diagram schematically illustrating the time-to-digital converter illustrated in FIG. 5.

Referring to FIGS. 5 to 6, the TDC 110 includes the first and second arbiter groups 122 and 124, and the signal processor 126, and a delay element unit 128.

Here, each of the first and second arbiter groups 122 and 124 may include at least one of at least two flip-flops and latches, but is not limited thereto.

In the exemplary embodiment, it is described that each of the first and second arbiter groups 122 and 124 includes the plurality of flip-flops, but the present invention is not limited thereto.

It is described that the plurality of flip-flops 122_1 to 122_N, and 124_1 to 124_N are D flip-flops, and the reference clock Fdiv and the input clock Fref are input to each of the plurality of flip-flops 122_1 to 122_N, and 124_1 to 124_N, and each of the plurality of flip-flops 122_1 to 122_N, and 124_1 to 124_N outputs the logic value for the phase difference between the reference clock Fdiv and the input clock Fref.

First, at least one of the plurality of flip-flops 122_1 to 122_N included in the first arbiter group 122 may have an offset different from that of another flip-flop, but is not limited thereto.

Accordingly, the plurality of flip-flops 122_1 to 122_N included in the first arbiter group 122 may have a first average offset, and transmits a first logic value including a logic value output from each of the plurality of flip-flops 122_1 to 122_N to the signal processor 126.

At least one of a plurality of flip-flops 124_1 to 124_N included in the second arbiter group 124 may have an offset different from another flip-flop, and is not limited thereto.

Accordingly, the delay element unit 128 is disposed at a front end of the TDC 110 so that the plurality of flip-flops 124_1 to 124_N included in the second arbiter group 124 may have a second average offset, and as a result, the plurality of flip-flops 124_1 to 124_N transmit second logic values including the logic values output from the plurality of respective flip-flops 124_1 to 124_N to the signal processor 126.

Here, the logic value output from each of the plurality of flip-flops 122_1 to 122_N, and 124_1 to 124_N included in the first and second arbiter groups 122 and 124 may be varied according to a time difference compensating for an offset according to a time difference at rising edges between the reference clock Fdiv and the input clock Fref.

The delay element unit 128 phase-delays the reference clock Fdiv to transmit the phase-delayed reference clock Fdiv to the second arbiter group 124.

That is, the reference clock Fdiv transmitted to the second arbiter group 124 has a difference from the reference clock Fdiv transmitted to the first arbiter group 122 by a phase delay time set in the delay element unit 128.

The signal processor 126 may include the adder 126_1 for adding the first and second logic values, and the inverse function signal processor 126_2 for processing inverse function signals for the first and second logic values added in the adder 126_1, and outputting a quantized and delayed digital bit.

In the exemplary embodiment, it is described that the TDC 110 includes the two first and second arbiter groups 122 and 124, but the TDC 110 is not limited thereto.

That is, in a case where the TDC 110 includes three arbiter groups, the offset distribution diagram illustrated in FIG. 4 may have the Gaussian distribution in which a general arbiter group has a statistically ideal offset, and an offset average value ($\mu$=0), and has an average value ($\mu$=td) of any one of the first and second arbiter groups 122 and 124, and may have an average value (($\mu$=−td) of the other one thereof.

In this case, the first and second arbiter groups 122 and 124 have the first and second offset average values ($\mu$=td and $\mu$=−td), which are formed wider than the offset average value ($\mu$=0), so that the operation range of the TDC 110 may be increased.

As described above, when the operation range of the TDC 110 is increased, resolution may be decreased, and the resolution and the operation range may be adjusted.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A digital phase-locked-loop, comprising:
a time-to-digital converter (TDC) configured to output a digital bit based on an input clock and a reference clock, wherein the TDC comprises:
a first arbiter group configured to compensate for a phase difference between the input clock and the reference clock with a first average offset and output a first logic value;
a second arbiter group configured to compensate for a phase difference between the input clock and the reference clock with a second average offset and output a second logic value; and
a signal processor configured to output the digital bit based on the first and second logic values,
wherein each of the first and second arbiter groups includes at least two flip-flops or latches, and at least one of the at least two flip-flops or latches has an offset different from that of another flip-flop or latch.

2. The digital phase-locked loop of claim 1, wherein each of the first and second arbiter groups includes at least two flip-flops or latches.

3. The digital phase-locked loop of claim 1, wherein the first average offset is different from the second average offset.

4. The digital phase-locked loop of claim 1, wherein the first arbiter group includes a plurality of flip-flops, and
each of the plurality of flip-flops compensates for a phase difference between the input clock and the reference clock with a predetermined offset, and transmits the first logic value to the signal processor.

5. The digital phase-locked loop of claim 1, wherein the second arbiter group includes a plurality of flip-flops, and
each of the plurality of flip-flops compensates for a phase difference between the input clock and the reference clock with a predetermined offset, and transmits the second logic value to the signal processor.

6. The digital phase-locked loop of claim 1, further comprising:
a phase delay unit configured to phase delay the input clock input in the second arbiter group.

7. The digital phase-locked loop of claim 1, wherein the signal processor comprises:
an adder configured to adding the first and second logic values; and
an inverse function signal processor configured to process inverse function signals for the first and second logic values added in the adder and output the quantized and delayed digital bit.

* * * * *